(12) United States Patent
Kittl et al.

(10) Patent No.: US 9,634,140 B2
(45) Date of Patent: Apr. 25, 2017

(54) FABRICATING METAL SOURCE-DRAIN STRESSOR IN A MOS DEVICE CHANNEL

(71) Applicant: Samsung Electronics Co., Ltd., Gyeonggi-do (KR)

(72) Inventors: Jorge A. Kittl, Round Rock, TX (US); Ganesh Hegde, Austin, TX (US); Mark S. Rodder, Dallas, TX (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/934,045

(22) Filed: Nov. 5, 2015

(65) Prior Publication Data

US 2016/0133745 A1     May 12, 2016

Related U.S. Application Data

(60) Provisional application No. 62/077,864, filed on Nov. 10, 2014.

(51) Int. Cl.
| | |
|---|---|
| *H01L 29/78* | (2006.01) |
| *H01L 29/66* | (2006.01) |
| *H01L 21/768* | (2006.01) |
| *H01L 21/285* | (2006.01) |
| *H01L 21/74* | (2006.01) |

(52) U.S. Cl.
CPC .... *H01L 29/7845* (2013.01); *H01L 21/28518* (2013.01); *H01L 21/28568* (2013.01); *H01L 21/76843* (2013.01); *H01L 21/76855* (2013.01); *H01L 21/76897* (2013.01); *H01L 29/66636* (2013.01); *H01L 29/66643* (2013.01); *H01L 29/7848* (2013.01); *H01L 21/743* (2013.01)

(58) Field of Classification Search
CPC ......... H01L 21/28518; H01L 21/28568; H01L 21/76843; H01L 21/76855; H01L 21/76897; H01L 29/66636; H01L 29/66643; H01L 29/7848
See application file for complete search history.

(56) References Cited

U.S. PATENT DOCUMENTS

| | | |
|---|---|---|
| 7,608,515 B2 | 10/2009 | Chen |
| 7,759,199 B2 | 7/2010 | Thomas |
| 7,838,887 B2 | 11/2010 | Woon |
| 7,927,989 B2 | 4/2011 | Zhang |
| 8,154,084 B2 | 4/2012 | Hoentschel |
| 8,361,879 B2 | 1/2013 | Gutmann |
| 8,368,147 B2 | 2/2013 | Cheng |
| 8,659,089 B2 | 2/2014 | Ko |
| 8,716,090 B2 | 5/2014 | Qin |
| 2012/0091540 A1 | 4/2012 | Cheng |
| 2014/0252412 A1 | 9/2014 | Tsai |

*Primary Examiner* — Mohammad Choudhry
(74) *Attorney, Agent, or Firm* — Convergent Law Group LLP

(57) ABSTRACT

Exemplary embodiments provide methods and systems for fabricating a metal source-drain stressor in a MOS device channel having improved tensile stress. Aspects of exemplary embodiment include forming a recess in source and drain areas; forming a metal contact layer on surfaces of the recess that achieves low contact resistivity; forming a metallic diffusion barrier over the metal contact layer; forming a layer M as an intimate mixture of materials A and B that substantially fills the recess; capping the layer M with a capping layer so that layer M is fully encapsulated and the capping layer prevents diffusion of A and B; and forming a compound AxBy within the layer M via a thermal reaction resulting in a reacted layer M comprising the metal source-drain stressor.

34 Claims, 6 Drawing Sheets

FABRICATING METAL SOURCE-DRAIN STRESSOR IN A MOS DEVICE CHANNEL

CROSS-REFERENCE TO RELATED APPLICATIONS

This application claims the benefit of priority of provisional Patent Application Ser. No. 62/077,864 filed on Nov. 10, 2014, is assigned to the assignee of the present application and herein incorporated by reference.

BACKGROUND

It is known that silicides in source and/or drain regions can induce strain in channels of metal-oxide-semiconductor field-effect transistor (MOSFET) devices. A silicide in the source/drain (SD) is typically a result of the reaction of a metal layer with SD/channel materials of the semiconductor device. Studies of nickel (Ni), cobalt (Co) and titanium (Ti) silicides used in source and drains for silicon (Si) CMOS technologies, show that the resulting strains induced by silicides on the channel are typically tensile, and originate mostly from the difference in thermal expansion coefficients between the silicide and the substrate/channel material.

Typically, the silicide formation does not result by itself in a net stress since the temperature of the last silicidation step which forms the final silicide phase is typically above or around a silicide-silicon interface relaxation temperature. Upon cooling, a tensile stress is typically developed due to the higher coefficient of thermal expansion of silicides when compared to silicon. However, stress due to difference in thermal expansion coefficient between silicide and substrate or channel is limited. On the other hand, the reaction of a metal film with a semiconductor, may lead to the formation of a compound (silicide if the semiconductor is Si) that occupies typically less volume than the combined volumes of the reacting metal and semiconductor layers. If the available volume is constrained, for example by encapsulation, although some tensile strain may be developed, however, the main result in this case is the formation of voids. That is, most of the reduction of volume is accommodated by the creation of voids, with little or no tensile strain resulting.

Accordingly, it would be desirable to provide an improved metal source-drain stressor for tensile channel stress.

BRIEF SUMMARY

The exemplary embodiment provides methods and systems for fabricating a metal source-drain stressor in a MOS device channel having improved tensile stress. Aspects of exemplary embodiment include forming a recess in source and drain areas; forming a metal contact layer on surfaces of the recess that achieves low contact resistivity; forming a metallic diffusion barrier over the metal contact layer; forming a layer M as an intimate mixture of materials A and B that substantially fills the recess; capping the layer M with a capping layer so that layer M is fully encapsulated and the capping layer prevents diffusion of A and B; and forming a compound $A_xB_y$ within the layer M via a thermal reaction resulting in a reacted layer M comprising the metal source-drain stressor.

BRIEF DESCRIPTION OF SEVERAL VIEWS OF THE DRAWINGS

These and/or other features and utilities of the present general inventive concept will become apparent and more readily appreciated from the following description of the embodiments, taken in conjunction with the accompanying drawings of which.

DETAILED DESCRIPTION

Figure 1:
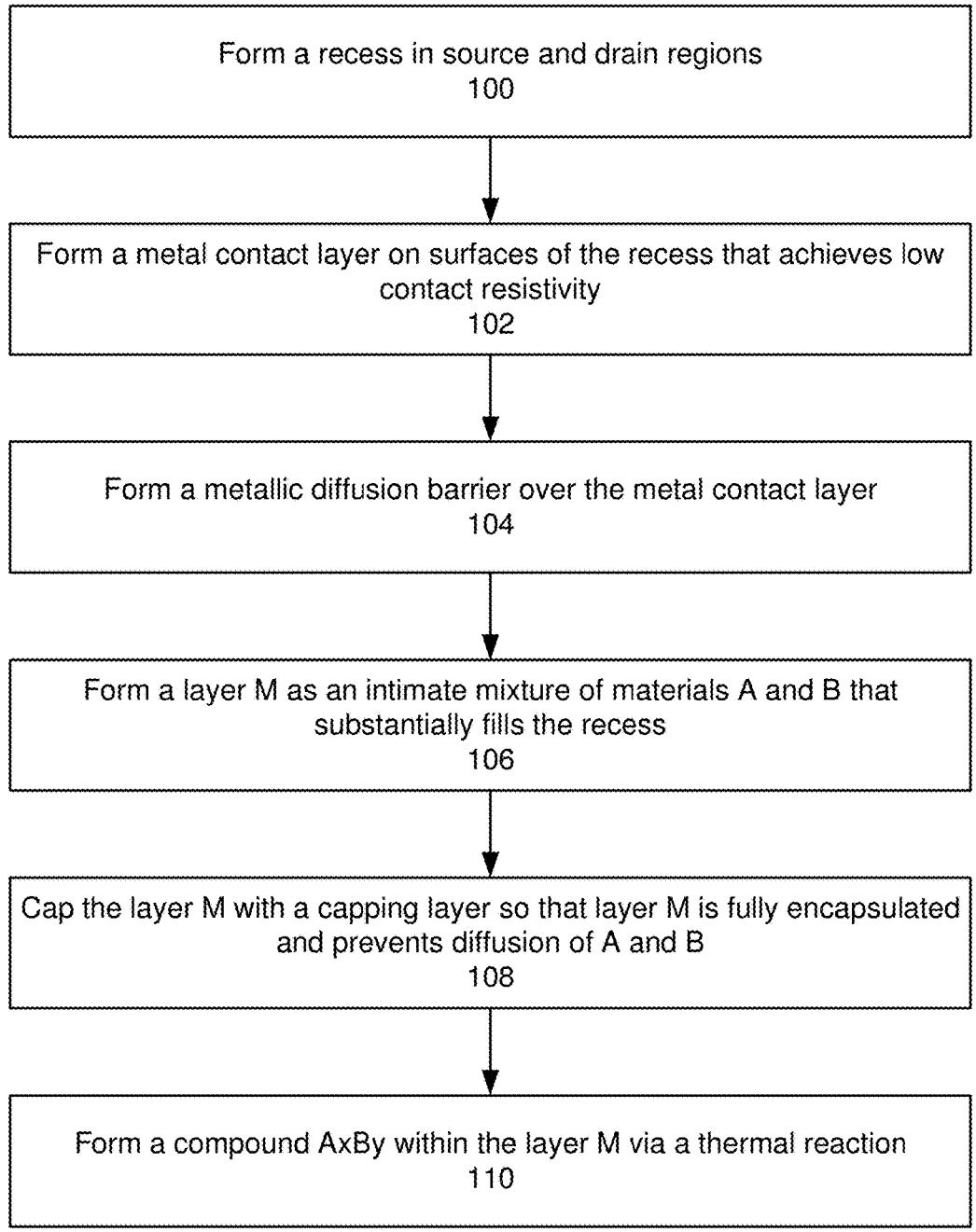
FIG. 1 is a flow diagram illustrating an exemplary embodiment of a method of fabricating a tensile metal source-drain stressor for tensile channel stress in a MOS device.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Advantages and features of the present invention and methods of accomplishing the same may be understood more readily by reference to the following detailed description of embodiments and the accompanying drawings. The present general inventive concept may, however, be embodied in many different forms and should not be construed as being limited to the embodiments set forth herein. Rather, these embodiments are provided so that this disclosure will be thorough and complete and will fully convey the concept of the general inventive concept to those skilled in the art, and the present general inventive concept will only be defined by the appended claims. In the drawings, the thickness of layers and regions are exaggerated for clarity.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The present embodiments provide methods to improve tensile stress in the channel of a MOS (metal-oxide-semiconductor) device induced by reacted metal source/drain (SD) stressors, so as to increase the performance of the MOS device.

The methods include forming a recessed SD, followed by formation of a thin contact layer that achieves low contact resistivity, and formation of a thin metallic diffusion barrier (that prevents diffusion of materials A and B into the channel). A layer M is then deposited into the recess, which in its as-deposited form, is an intimate mix (e.g. amorphous mixture achieved by co-deposition, or nanolaminate stack with layers in 0.1-4 nm range) of two materials A and B and filling substantially the SD recess. Layer M is then capped by another layer that prevents upward diffusion of A and B, so that layer M is fully encapsulated. The encapsulation of layer M is then followed by a thermal reaction resulting in formation of a compound AxBy within layer M (which may be substantially the whole layer M after reaction). These steps are not necessarily immediately following each other, and can be intercalated in the fabrication flow of an integrated circuit.

In one preferred embodiment, the materials are chosen such that the volume of the layer M after reaction would be smaller if in relaxed state, than the volume of the layer M before reaction; and the volume of compound AxBy if in relaxed state is smaller than the original volume of the stoichiometric mixture of A and B. Layer M after reaction is metallic and has a larger coefficient of thermal expansion than the semiconducting SD/channel layers. The result is a SD metal stressor layer that induces tensile strain in the channel, with an overall SD design that also achieves low leakage and low contact resistivity. This method may be applied to the SD of MOS (e.g., nMOS) devices with channel materials that have an increased mobility under tensile strain.

FIG. 1 is a flow diagram illustrating an exemplary embodiment of a method of fabricating a tensile metal source-drain stressor for tensile channel stress in a MOS device. The following process steps are intended to be inserted into the fabrication flow of an integrated circuit. The process steps are not necessarily following immediately after the previous step, but additional steps may be intercalated in some cases as suited. The fabrication process is suitable for many types of device geometries including planar, Fin, nanowire and nanosheet MOS devices.

Figure 2:
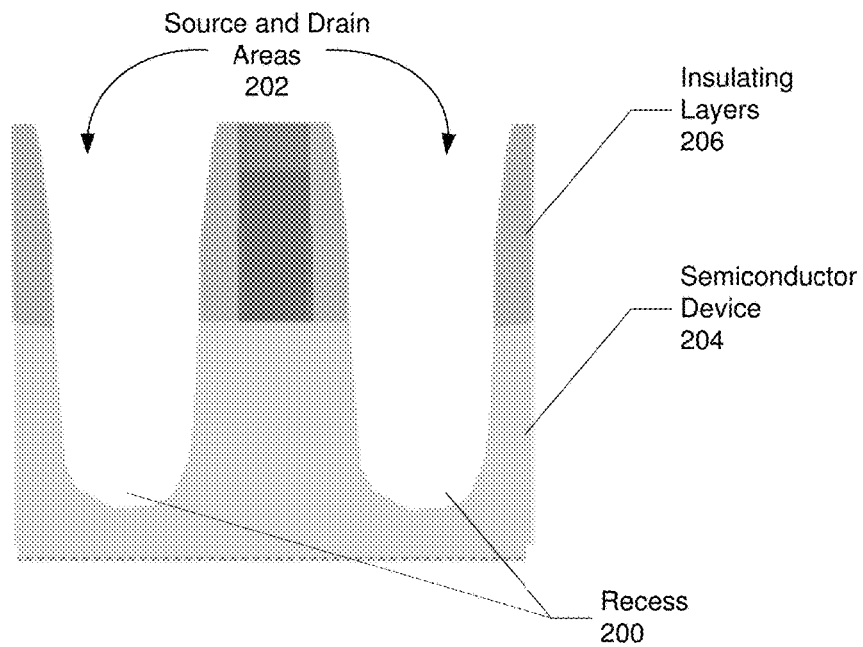
FIG. 2 is a diagram illustrating a recess formed in the source and drain areas of a semiconductor device.

The method may begin by forming a recess in source and drain areas (block 100). FIG. 2 is a diagram illustrating a recess 200 formed in the source and drain areas 202 of a semiconductor device 204. The semiconductor device 204 may also include insulating layers 206 formed on top of the semiconductor device 204. As shown, the recess 200 may be formed through both insulating layers 206 as well as the semiconductor device 204.

Referring again to FIG. 1, a metal contact layer is then formed on surfaces of the recess that achieves low contact resistivity (block 102) such as a contact resistivity of $10^{-7}$ ohm-cm$^2$ or lower. In the preferred embodiments, the contact resistivity is of about $10^{-8}$ ohm-cm$^2$ or lower. The metal contact layer or stack may include reacted metal-semiconductor compound, and is preferably optimized to achieve low contact resistivity interface (low rhoc) to the semiconductor and to avoid leakage. In one embodiment, the metal contact layer may have a thickness of less than 5 nm, and more particularly, a thickness of 1 to 3 nm.

Figure 3:
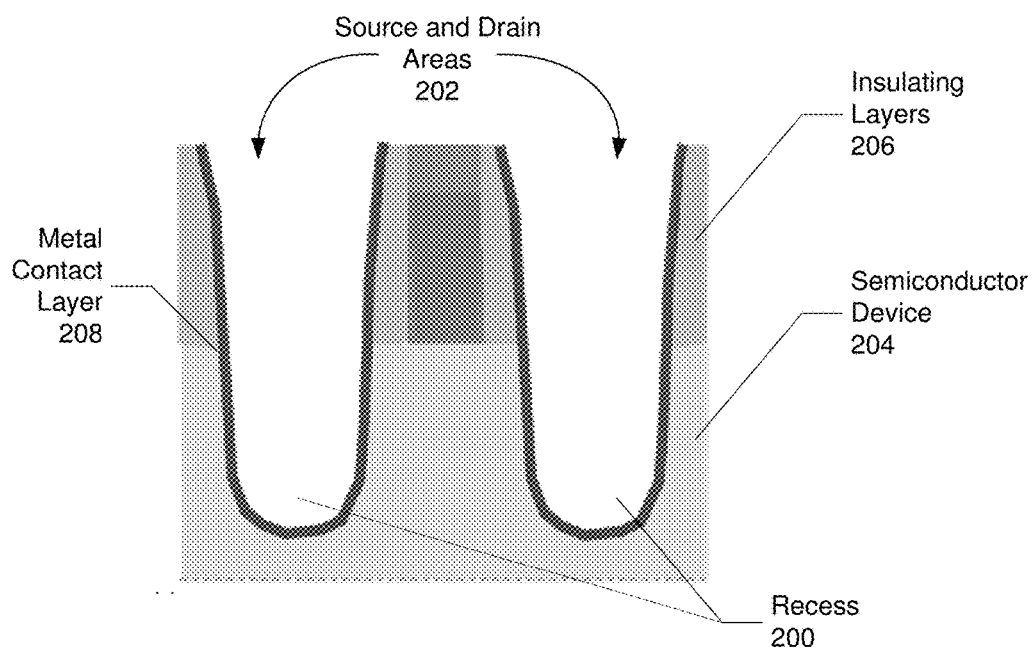
FIG. 3 is a diagram illustrating the metal contact layer on surfaces of the recess.

FIG. 3 is a diagram illustrating the metal contact layer on surfaces of the recess. For simplicity, the thin metal contact layer 208 is represented as one layer, but may comprise a multi-layer stack. In one embodiment, the metal contact layer 208 covers the surface of the recess 200 in regions adjacent to the semiconductor device 204 and the insulating layers 206. It is to be understood that the metal contact layer 208 in regions in contact with the semiconductor device 204 may be (e.g. due to reaction and compound (e.g. silicide) formation) different from the metal contact layer 208 in regions that are next to the insulating layers 206. In other embodiments, such as in self-aligned reacted metal-semiconductor processes (such as salicide processes) the metal contact layer 208 may be only present along the surface of the recess 200 in regions next to the semiconductor device 204.

The metal contact layer 208 may be formed by deposition and optionally reaction (e.g. forming a silicide if the semiconductor in the source and/or drain is silicon (Si)) of a thin metal layer or layers. The formation of the metal contact layer 208 may optionally include additional processes known in the art, including but not limited to, dopant segregation, impurity segregation, chalcogenide passivation, etc., in order to achieve a low interface contact resistance and stable interface.

The metal or reacted metal comprising the metal contact layer 208 may include Titanium (Ti) and/or Ti-compounds, and/or Cobalt (Co) and/or Co compounds, and/or refractory metals and/or reacted refractory metals, and/or rare-earth metals and/or reacted rare-earth metals and/or heavy alkaline earth metals and/or reacted heavy alkaline earth metals. The metal contact layer 208 may be formed of a thin insulator (for example with thickness of about 2 nm or less, in preferred embodiments of about 1 nm or less) and a metal, including metal-insulator-semiconductor (MIS) contacts. The metal in the metal contact layer 208 may include a low work function metal, such as but not limited to, Titanium Aluminum (TiAl), Titanium Carbon (TiC), Titanium Aluminum Carbon (TiAlC), rare earths or their alloys, Ti or low work function Ti-alloys, alkaline earth metals or their alloys.

The step of forming the metal contact layer 208 may be typically performed after contact hole or trench opening. FIG. 3 and other figures are simplified, and would correspond in this example to a particular scheme using self-aligned contact holes or trenches, but other combinations and structures are possible. Note that if a self-aligned reacted metal-semiconductor process (such as a salicide) is used, then this step can be performed at an earlier position in the flow (e.g. before replacement metal gate (RMG) module if RMG is used.

Figure 4:
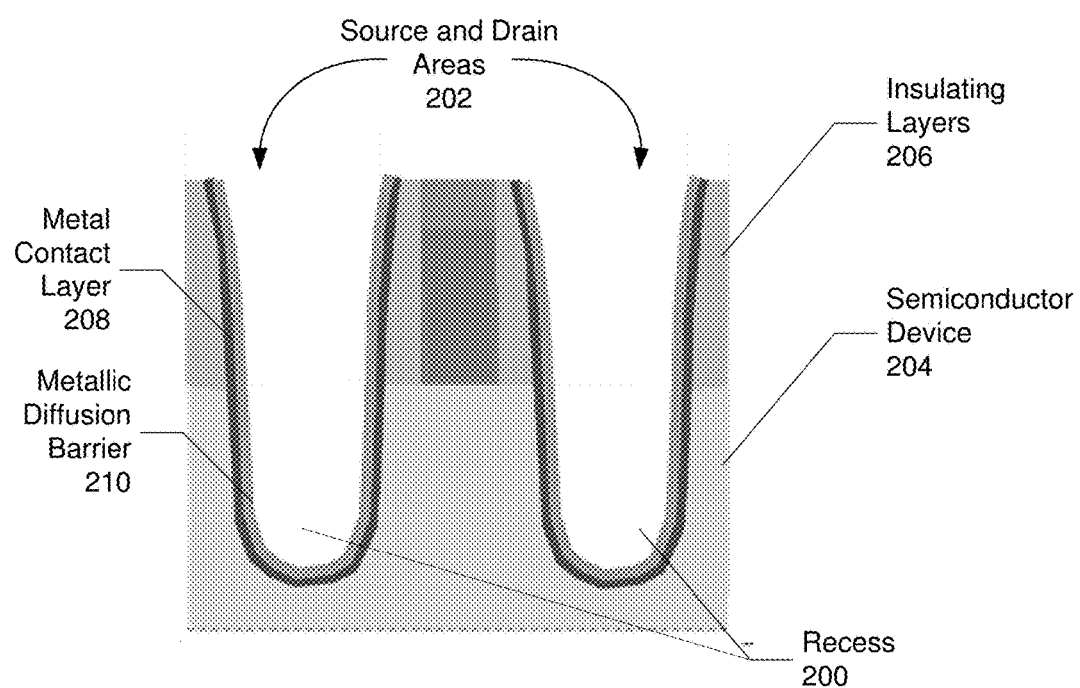
FIG. 4 is a diagram illustrating formation of a metallic diffusion barrier over the metal contact layer.

Referring again to FIG. 1, the process includes forming a metallic diffusion barrier over the metal contact layer (block 104). FIG. 4 is a diagram illustrating formation of a metallic diffusion barrier 210 over the metal contact layer 208. The diffusion barrier 210 is designed to effectively block diffusion of materials A and B contained in a layer M that is to be subsequently deposited (see FIG. 1 block 106).

As used herein, forming a metallic diffusion barrier over the metal contact layer also includes the case where the metallic diffusion barrier is effectively provided by the metal contact layer 208. The metal contact layer 208 may provide an effective diffusion barrier when metal contact layer 208 comprises an MIS stack with an insulating layer that blocks diffusion, or comprises a low rhoc stack including a metallic diffusion barrier layer (e.g. TiSiN or TiN).

In one embodiment, formation of the metallic diffusion barrier 210 may be performed after contact hole opening. In one embodiment, metallic diffusion barrier 210 and may comprise Titanium Nitride (TiN), Tantalum Nitride (TaN), Titanium Silicon Nitride (TiSiN), Tantalum Silicon Nitride (TaSiN), a nitrided Ti compound, or a nitrided Ta compound. In some embodiments, the metallic diffusion barrier 210 formed prior to formation of layer M is thin at less than 5 nm thick. In preferred embodiments, this layer is less than 2 nm thick.

Optionally, a thin seed layer (e.g. <4 nm) for nucleation of compound AxBy may also be formed in block 104 after formation of the diffusion barrier and before formation of layer M. Optionally, the seed layer may contain the compound AxBy. As example, if AxBy is a silicide, then the nucleation layer may be a crystalline AxBy silicide film as well. This may be formed by deposition followed by crystallization anneal of a thin AxBy layer. In some embodiments, the thin seed layer may be formed by deposition of a thin layer containing materials A and B and then reacted to form compound AxBy. In some embodiments, the above process may be applied to the SD of nMOS devices with channel materials that have an increased mobility under tensile strain.

Referring again to FIG. 1, the process includes forming a layer M as an intimate mixture of materials A and B that substantially fills the recess in the semiconductor device 204 (block 106). The materials comprising A and B may be chosen such that the volume of the compound AxBy after reaction is smaller than the original volume of the stoichiometric mixture of A and B. This is for many materials the case if the layer deposited is either an amorphous mixture or a nanolaminate of components A and B.

Figure 5A:
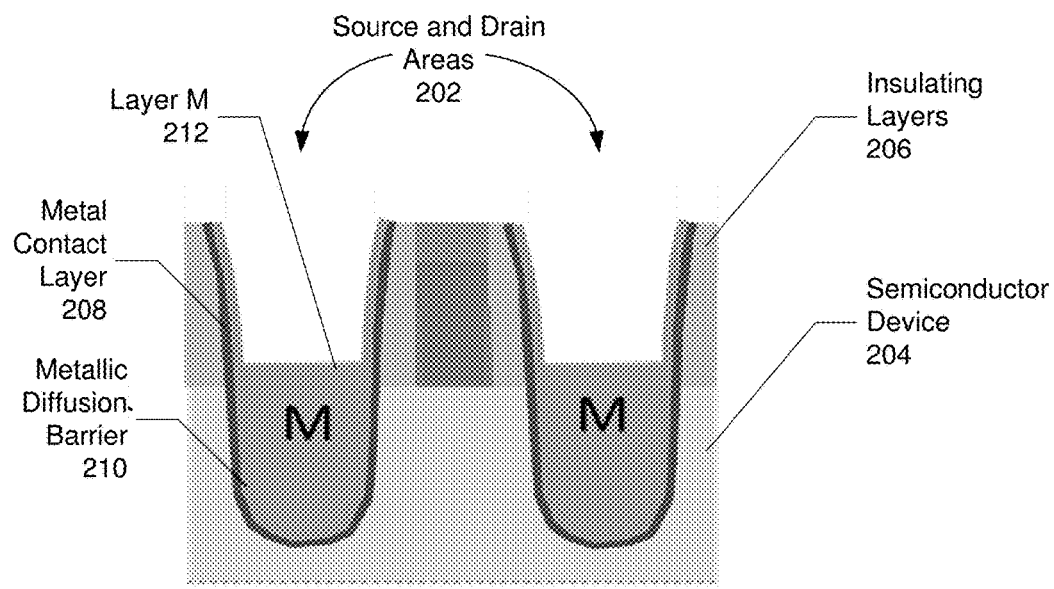
FIGS. 5A and 5B are diagrams illustrating the layer M substantially filling the recess of the semiconductor device.
Figure 5B:
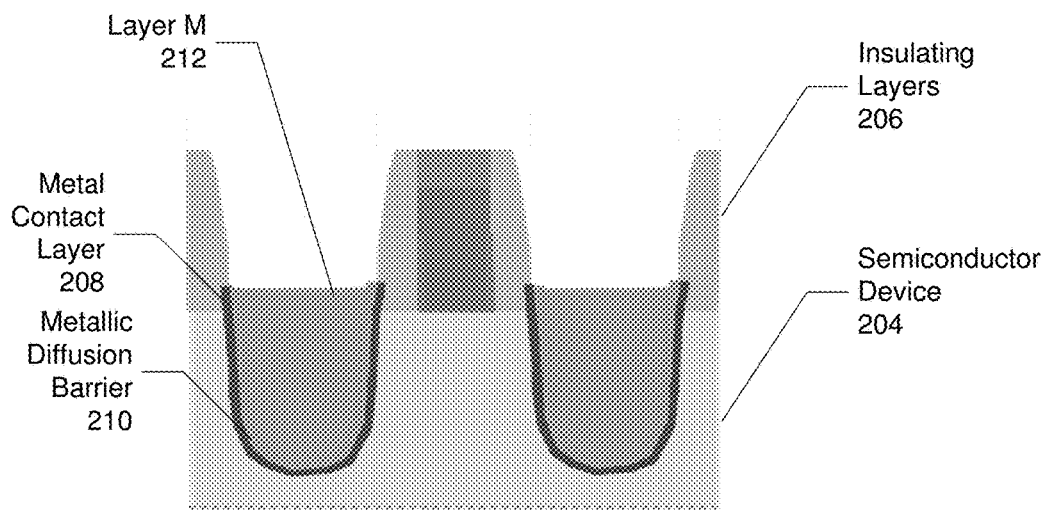

FIGS. 5A and 5B are diagrams illustrating the layer M substantially filling the recess of the semiconductor device. FIG. 5A shows an embodiment where the metal contact layer 208 and the optional metallic diffusion barrier 210 extend on the walls of the recess 200 to the top of the insulating layers 206. FIG. 5B shows another embodiment where the metal contact layer 208 and the optional metallic diffusion barrier 210 extend on the walls of the recess 200 up to about or slightly past the top surface of the semiconductor device 204. In either embodiment, the layer M 212 may have a height of up to 20 to 40 nm, for example, above the surface of the original semiconductor device 204, or may have a height aligned about the surface of the original semiconductor device.

Layer M may be deposited either by directional deposition or conformal deposition processes, resulting in different possible geometric orientations of the stack. Layer M may be formed as a mixture of A and B in proportions that lead to a close to stoichiometric AxBy compound. In some embodiments, the compound AxBy may comprise a crystalline compound. In some embodiments, layer M may be formed as a mixture of A and B in proportions that lead to formation of an AxBy compound in a matrix of A, or in a nanolaminate structure with additional layers of substantially A. In some embodiments, the deposited layer M may have compound (or crystalline) phases within, but not in the final targeted AxBy compound structure.

Layer M may be formed or deposited at low temperature (e.g. at room temperature less than 300 C) to prevent crystallization that would lead to AxBy compound formation during deposition. The layer M 212 may be an amorphous mixture of A and B (e.g. achieved by co-deposition, deposition from a composite or mixed source or target, or deposited by ALD, or CVD or PVD, etc.). In one embodiment, layer M may be formed as a nanolaminate stack having a layer thicknesses, for example, of approximately 0.1 to 4 nm. In one embodiment, the layer M is a low resistivity layer of approximately 300 micro ohm-cm or less.

In one embodiment, the layer M comprises a nanolaminate structure in which layers of mixtures of A and B (e.g. amorphous layers) can be alternated with layers of A in order to target predetermined volume contractions upon formation of compound AxBy, leaving a residual amount of A. In another embodiment, the layer M may comprise of a nanolaminate of A and B, such that the resulting structure after the thermal reaction is a compound AxBy and an additional layer A either in nanolaminate or other resulting geometry.

The layer M may be formed such that after the thermal reaction the reacted layer M is either substantially made of compound AxBy, or is substantially made of a mixture of compound AxBy and A. In some embodiments, the compound AxBy and optional residual A matrix of the layer M after the thermal reaction are designed so that the theoretical volume contraction (comparing the initial volume of the deposited mixture of A and B to the final volume after reaction of the AxBy compound and optional matrix of A if in relaxed state) of the reacted layer M should be in a range of 1-10% to prevent cracking or voiding.

In one embodiment, the materials A and B are metals. In some embodiments, material A may be a metal and material B a semiconductor. In some embodiments, Material A may comprise a metal Nickel (Ni), Cobalt (Co), Titanium (Ti), Tantalum (Ta), Tungsten (W), Molybdenum (Mo), or other refractory metals and material B comprises a semiconductor including Silicon (Si) or a Silicon Germanium (SiGe) alloy. In one embodiment, the compound AxBy is a low resistivity silicide or germanosilicide phase such as NiSi or CoSi2. The proportions of the materials A and B can be chosen to lead to a low resistivity silicide phase (e.g., NiSi or CoSi2) embedded in a matrix of or forming a nanolaminate structure with the metal A. For most silicides, the volume of the resulting silicide is smaller than the addition of the volumes of the unreacted metal and Si that led to the formation of the silicide. Volume contractions in silicide formation can be as large as 20-40%. For this reason, a significantly larger proportion of metal can be included in the original layer, so that the overall theoretical contraction of the ranges from 1-10%. Example of mixtures of the layer M deposited in this step may include the material A being in proportion of 70-90% metal and the remainder comprising Si.

If the theoretical volume contraction upon formation of the AxBy compound from a stoichiometric mixture of A and B does not have excessive contraction (i.e., contraction is not in excess of about 20%), then having a residual matrix A after reaction is optional.

Referring again to FIG. 1, the process includes capping the layer M with a capping layer so that layer M is fully encapsulated and the capping layer prevents diffusion of A and B (block 108). In one embodiment, the capping comprises a metallic encapsulation layer.

Figure 6A:
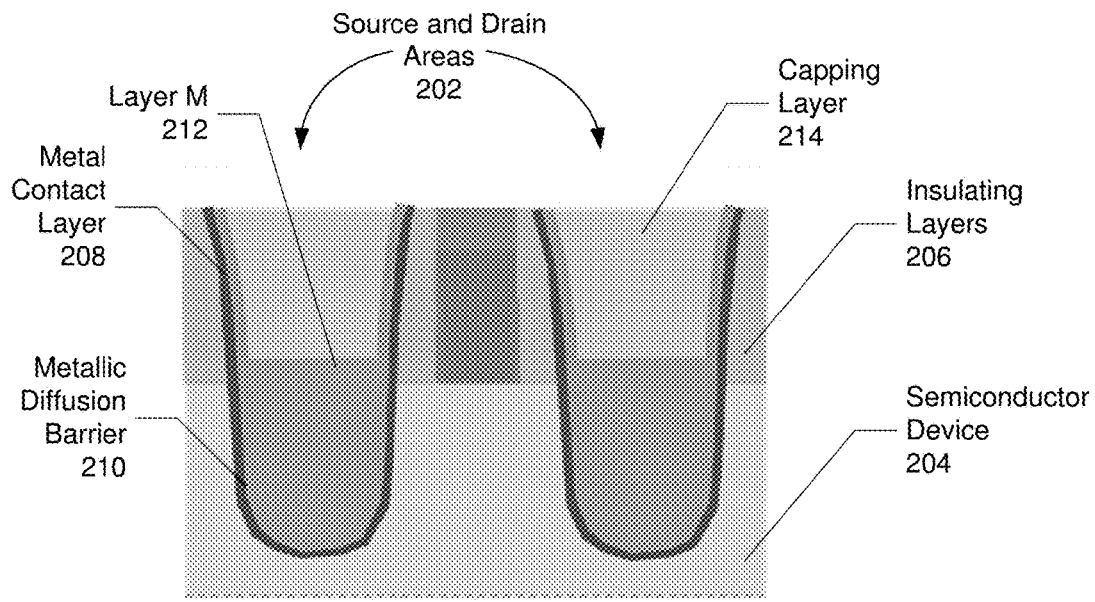
FIGS. 6A and 6B are diagrams illustrating a capping layer formed over the layer M.
Figure 6B:
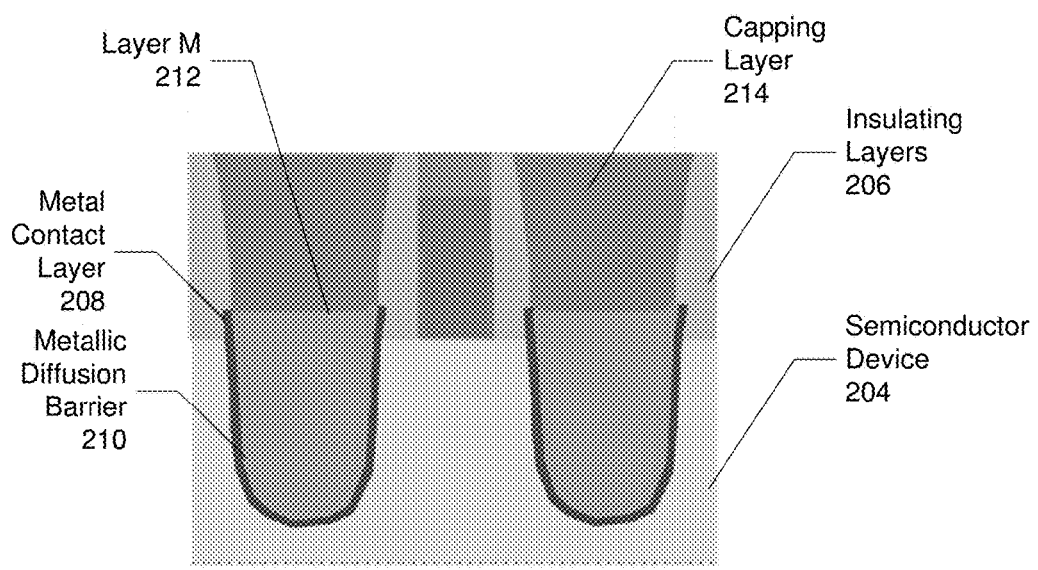

FIGS. 6A and 6B are diagrams illustrating a capping layer formed over the layer M. FIG. 6A shows an embodiment of the capping layer formed over the layer M where the metal contact layer 208 and the optional metallic diffusion barrier 210 extend on the walls of the recess 200 to the top of the insulating layers 206. FIG. 6B shows another embodiment of the capping layer formed over the layer M where the metal contact layer 208 and the optional metallic diffusion barrier 210 extend the walls of the recess 200 to about or slightly past the top surface of the semiconductor device 204 (following the example in FIG. 5B).

The capping layer 214 is deposited to encapsulate layer M before the thermal reaction and is formed in the recess over the layer M to a top surface of the insulating layers 206. In one embodiment, the capping layer may comprise a metal fill (with appropriate diffusion, nucleation or seed barrier layers as needed) which may be followed by CMP (chemical mechanical polishing). In another embodiment, the capping layer 214 may comprise an insulating layer. In one embodiment, the metal contact layer may be formed by deposition and reaction to form a silicide if a source and drain comprises silicon, or a semiconductor-metal compound if the source and drain are of a semiconductor material other than Si.

Referring again to FIG. 1, the process includes forming a compound AxBy within the layer M via a thermal reaction resulting in a reacted layer M (block 110).

Figure 7A:
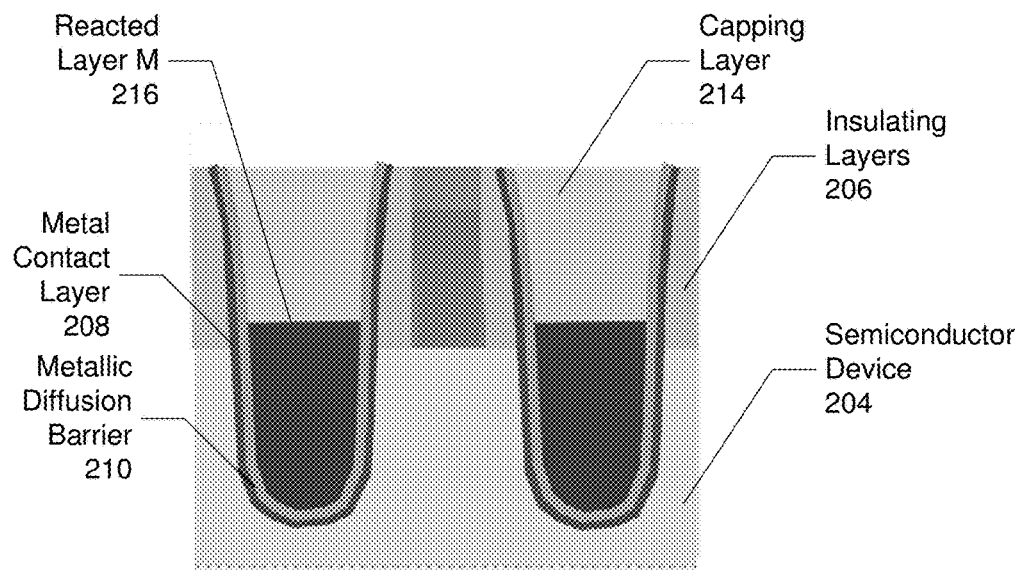
FIGS. 7A and 7B are diagrams illustrating a reacted layer M comprising compound $A_xB_y$ after a thermal reaction.
Figure 7B:
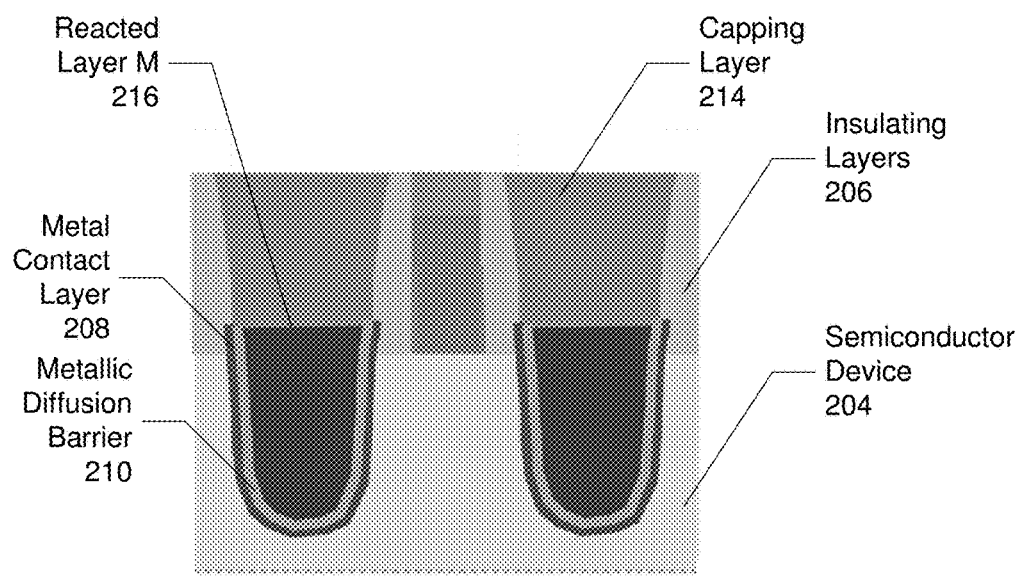

FIGS. 7A and 7B are diagram illustrating a reacted layer M 216 comprising compound AxBy after the thermal reaction. FIG. 7A shows an embodiment with the reacted layer M 216 where the metal contact layer 208 and the optional metallic diffusion barrier 210 extend the walls of the recess 200 to the top of the insulating layers 206. FIG. 7B shows another embodiment where an insulating capping layer is formed over the layer M and where the metal contact layer 208 and the optional metallic diffusion barrier 210 extend on the walls of the recess 200 to about or slightly past the top surface of the semiconductor device 204 (following the example in FIG. 6B).

The temperature of the thermal reaction/process used to form the reacted layer M 216 may be lower than typically needed to react bi-layers, since due to the intimate mixture of components A and B, long range diffusion is not needed. As a consequence, void formation (which requires long range diffusion) is prevented. In addition, in some embodiments, a reaction thermal budget to form compound AxBy can also be kept below a thermal budget of stress relaxation of the compound AxBy. For example, if the AxBy compound is a Ti silicide, then, in some embodiments the thermal budget is kept below about 600 C, if the AxBy compound is a Ni silicide, then, in some embodiments the thermal budget is kept below about 400 Cm.

The process can be tailored by monitoring the resulting stress after cool down vs reaction thermal budget and choosing the adequate thermal budget for stress maximization. This process is applicable to many other metallic alloys, but the alloy should also be chosen for low resistivity. The alloy should also be chosen so that the subsequent thermal cycles used to complete fabrication (back-end, etc.), are not capable of relaxing its stress. Alloys of refractory metals such as Ti, Ta, W or Mo will have high relaxation temperatures and be able to maintain stress withstanding higher thermal budgets. Deep recesses also give benefit in Rpara (parasitic resistance) due to larger metal-semiconductor interface area.

Since materials A and B were chosen so that the volume of the metal reacted layer M after the thermal reaction would be smaller if in relaxed state than the volume of the layer M before reaction, and since layer M is fully encapsulated and the intimate mixture of the as deposited layer prevents void formation (and allows lower temperature reaction than in thicker bi-layers), the present embodiments achieve a metallic layer with tensile stress in the SD after the thermal reaction.

Additional stress can build up in cooling. The result being a SD metal stressor layer that induces tensile strain in the channel. The diffusion barrier prevents A or B from getting to the channel/substrate. In the preferred embodiments, AxBy is a crystalline compound. In some embodiments, the layer M after reaction is either substantially made of compound AxBy or is substantially made of a mixture of compound AxBy and A, such that the theoretical volume contraction (comparing the initial volume of the deposited mixture of A and B to the final volume in hypothetical relaxed state of the resulting layer after reaction) is not excessive, so that the material does not crack or void. In some embodiments, the actual volume contraction targeted should be in the few % range (e.g. 1-10%), to prevent cracking or voiding. In some embodiments, the reaction thermal budget to form compound AxBy is kept below the thermal budget of stress relaxation.

In some embodiments, the capping layer 214 comprises an insulating layer, the opening of contact holes and contact formation follow in the process and may have a different geometry than the holes or trenches opened initially (e.g., may result in partial strap contacts to reduce gate-SD capacitance). Thermal budget of all subsequent processing after formation of compound AxBy is preferably kept below the thermal budget of stress relaxation.

A method and system of fabricating metal source-drain stressor in a MOS device channel has been disclosed. The present invention has been described in accordance with the embodiments shown, and there could be variations to the embodiments, and any variations would be within the spirit and scope of the present invention. Accordingly, many modifications may be made by one of ordinary skill in the art without departing from the spirit and scope of the appended claims.

We claim:

1. A method of fabricating metal source-drain stressor in a MOS device channel, comprising:
    forming a recess in source and drain areas;
    forming a metal contact layer on surfaces of the recess that achieves low contact resistivity;
    forming a metallic diffusion barrier over the metal contact layer;
    forming a layer M as an intimate mixture of materials A and B that substantially fills the recess;
    capping the layer M with a capping layer so that layer M is fully encapsulated and the capping layer prevents diffusion of A and B; and
    forming a compound AxBy within the layer M via a thermal reaction resulting in a reacted layer M comprising the metal source-drain stressor.

2. The method of claim 1, wherein a volume of the compound AxBy if in relaxed state is smaller than the original volume of the stoichiometric mixture of A and B.

3. The method of claim 2, further comprising forming a seed layer for nucleation of compound AxBy after forming the metallic diffusion barrier and before formation of the layer M.

4. The method of claim 3, wherein the seed layer formed before formation of layer M contains the compound AxBy.

5. The method of claim 4, wherein the seed layer is formed by deposition of a thin layer of less than 4 nm containing the materials A and B and then reacted to form compound AxBy.

6. The methods of claim 1, further comprising forming the metallic diffusion barrier before formation of layer M at a thickness of less than 5 nm.

7. The method of claim 6, further comprising applying the process to the MOS device in which materials of the MOS device channel have an increased mobility under tensile strain.

8. The method of claim 1, further comprising forming the metal contact layer by deposition and reaction to form a silicide if a source and drain comprises silicon, or a semiconductor-metal compound if the source and drain are of a semiconductor material other than Si.

9. The method of claim 8, wherein the metal contact layer includes at least one of: Titanium (Ti) or Ti-compounds, Cobalt (Co) or Co compounds, refractory metals, reacted refractory metals, rare-earth metals, reacted rare-earth metals, heavy alkaline earth metals, and reacted heavy alkaline earth metals.

10. The method of claim 1, further comprising forming the mental contact layer of an insulator and a metal, including metal-insulator-semiconductor (MIS) contacts.

11. The method of claim 10, wherein the metal contact layer comprises at least one of: Titanium Aluminum (TiAl), Titanium Carbon (TiC), Titanium Aluminum Carbon (TiAlC), rare earths, Ti, or alkaline earth metals and alloys thereof.

12. The method of claim 1, wherein the metallic diffusion barrier formed before formation of layer M comprises at least one of: Titanium Nitride (TiN), Tantalum Nitride (TaN), Titanium Silicon Nitride (TiSiN), Tantalum Silicon Nitride (TaSiN), a nitrided Ti compound, or a nitrided Ta compound.

13. The method of claim 1, further comprising depositing the layer M directionally.

14. The method of claim 1, further comprising depositing the layer M conformally.

15. The method of claim 1, further comprising forming the layer M as a mixture of the materials A and B in proportions that lead to a close to stoichiometric $A_xB_y$ compound.

16. The method of claim 1, further comprising forming the layer M as a mixture of the materials A and B in proportions that lead to formation of an $A_xB_y$ compound in a matrix of A or in a nanolaminate structure with additional layers of substantially A.

17. The method of claim 1, further comprising forming the layer M at a temperature of less than 300 C that prevents crystallization leading to an $A_xB_y$ compound formation during deposition.

18. The method of claim 1, further comprising forming the layer M as amorphous.

19. The method of claim 1, further comprising forming the layer M as a nanolaminate stack having a layer thicknesses of approximately 0.1 to 4 nm.

20. The method of claim 1, further comprising forming the layer M such that the layer M comprises a nanolaminate structure in which layers of mixtures of the materials A and B are alternated with layers of A in order to target predetermined volume contractions upon formation of compound $A_xB_y$, leaving a residual amount of the material A.

21. The method of claim 1, further comprising forming the layer M such that in which layer M as formed is composed of a nanolaminate of the materials A and B, such that the resulting structure after reaction is a compound $A_xB_y$ and an additional layer A either in nanolaminate or other resulting geometry.

22. The method of claim 1, further comprising depositing the layer M such that layer M has compound phases within, but not in a final targeted $A_xB_y$ compound structure.

23. The method of claim 22, in which $A_xB_y$ is a crystalline compound.

24. The method of claim 1, further comprising forming the layer M such that after the thermal reaction the reacted layer M is either substantially made of compound $A_xB_y$, or is substantially made of a mixture of the compound $A_xB_y$ and the material A, such that volume contraction of the reacted layer M is in a range of 1-10% to prevent cracking or voiding.

25. The method of claim 24, further comprising keeping a reaction thermal budget to form the compound $A_xB_y$ below a thermal budget of stress relaxation of the compound $A_xB_y$.

26. The method of claim 25, further comprising keeping the thermal budget of all subsequent processing after formation of compound $A_xB_y$ below the thermal budget of stress relaxation.

27. The method of claim 26, wherein the layer M is a low resistivity layer of approximately 300 micro ohm-cm or less.

28. The methods of claim 26, wherein the material A comprises a metal, including at least one of Nickel (Ni), Cobalt (Co), Titanium (Ti), Tantalum (Ta), Tungsten (W), Molybdenum (Mo) or another refractory metal; and the material B comprises a semiconductor.

29. The method of claim 28, wherein the material B comprises including Silicon (Si) or a Silicon Germanium (SiGe) alloy, the compound $A_xB_y$ comprises a low resistivity silicide or germanosilicide phase including at least one of NiSi and $CoSi_2$, and the proportions of the materials A and B are chosen to lead to the $A_xB_y$ compound embedded in a matrix of or forming a nanolaminate structure with the metal A.

30. The method of claim 29, wherein the layer A in the layer M is in proportion of 70 to 90% metal.

31. The method of claim 1, wherein the materials A and B are metals.

32. The method of claim 1, wherein the material A is a refractory metal.

33. The method of claim 1, further comprising depositing the capping layer as a metallic layer.

34. The method of claim 1, further comprising depositing the capping layer as an insulating layer.

* * * * *